US010403528B2

(12) United States Patent
Komae et al.

(10) Patent No.: US 10,403,528 B2
(45) Date of Patent: Sep. 3, 2019

(54) SUBSTRATE-PROCESSING APPARATUS AND METHOD OF MANUFACTURING SEMICONDUCTOR DEVICE

(71) Applicant: HITACHI KOKUSAI ELECTRIC INC., Tokyo (JP)

(72) Inventors: Yasuaki Komae, Toyama (JP); Takashi Nogami, Toyama (JP); Tomoshi Taniyama, Toyama (JP); Shigeru Odake, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 66 days.

(21) Appl. No.: 15/682,730

(22) Filed: Aug. 22, 2017

(65) Prior Publication Data
US 2017/0352556 A1    Dec. 7, 2017

Related U.S. Application Data

(63) Continuation of application No. PCT/JP2016/058508, filed on Mar. 17, 2016.

(30) Foreign Application Priority Data

Mar. 25, 2015 (JP) ................... 2015-062658

(51) Int. Cl.
*H01L 21/677* (2006.01)
*B25J 18/02* (2006.01)
(Continued)

(52) U.S. Cl.
CPC ............ *H01L 21/677* (2013.01); *B25J 9/104* (2013.01); *B25J 18/02* (2013.01); *B65G 49/07* (2013.01);
(Continued)

(58) Field of Classification Search
CPC ............... H01L 21/67754; H01L 21/67748
See application file for complete search history.

(56) References Cited

U.S. PATENT DOCUMENTS 5,297,910 A * 3/1994 Yoshioka .......... H01L 21/67173
414/226.01
5,364,222 A * 11/1994 Akimoto ........... H01L 21/67781
414/225.01
(Continued)

FOREIGN PATENT DOCUMENTS

JP     11-043223 A    2/1999
JP   2006-128714 A    5/2006
(Continued)

*Primary Examiner* — Jonathan Snelting
(74) *Attorney, Agent, or Firm* — Volpe and Koenig, P.C.

(57) ABSTRACT

A substrate processing apparatus includes a process chamber and a transfer device configured to transfer a plurality of substrates to a substrate retainer. The transfer device includes a base; a first moving unit capable of linear motion; a first drive unit to drive the first moving unit. The first drive unit includes a first pulley group; a first motor coupled to a first pulley; and a first connecting member coupling the first belt and the first moving unit. A second moving unit is capable of linear motion. A second drive unit is in an enclosure of the first moving unit and drives the second moving unit. The second drive unit includes a second pulley group; a second belt wound on the second pulley group, a second motor coupled to drive a second pulley; and a second connecting member coupling the second belt and the second moving unit.

13 Claims, 15 Drawing Sheets

(51) Int. Cl.
*B65G 49/07* (2006.01)
*B25J 9/10* (2006.01)
*H01L 21/687* (2006.01)

(52) U.S. Cl.
CPC .... *H01L 21/6773* (2013.01); *H01L 21/67712* (2013.01); *H01L 21/67781* (2013.01); *H01L 21/68707* (2013.01)

(56) References Cited

U.S. PATENT DOCUMENTS

| | | | | |
|---|---|---|---|---|
| 5,607,276 | A | * | 3/1997 | Muka ................ H01L 21/67772 414/331.18 |
| 5,664,254 | A | * | 9/1997 | Ohkura ............... H01L 21/6715 396/611 |
| 5,972,110 | A | * | 10/1999 | Akimoto ........... H01L 21/67161 118/319 |
| 6,533,531 | B1 | * | 3/2003 | Nguyen ............ H01L 21/67709 414/225.01 |
| 7,956,286 | B2 | * | 6/2011 | Furuichi ........... H01L 21/67742 174/68.3 |
| 8,167,522 | B2 | * | 5/2012 | Duhamel .......... H01L 21/67276 414/217 |
| 8,444,363 | B2 | * | 5/2013 | Sakata ................ H01L 21/6719 414/217 |
| 2014/0350714 | A1 | | 11/2014 | Kimura et al. |
| 2015/0380288 | A1 | | 12/2015 | Hirano |

FOREIGN PATENT DOCUMENTS

| | | |
|---|---|---|
| JP | 2011-199121 A | 10/2011 |
| JP | 2013/150012 A | 8/2013 |
| JP | 2013-239587 A | 11/2013 |
| JP | 2014-175404 A | 9/2014 |
| JP | 2014-229757 A | 12/2014 |
| WO | 2016/052023 A1 | 4/2016 |

* cited by examiner

FIG. 10A
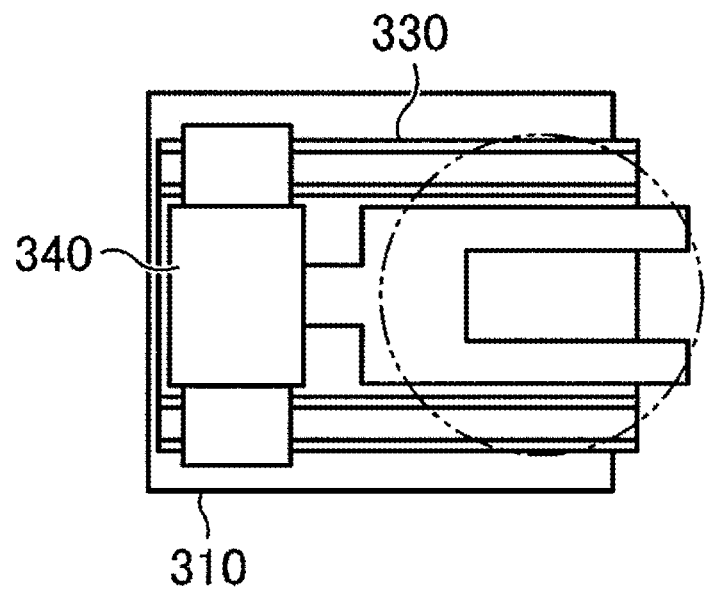
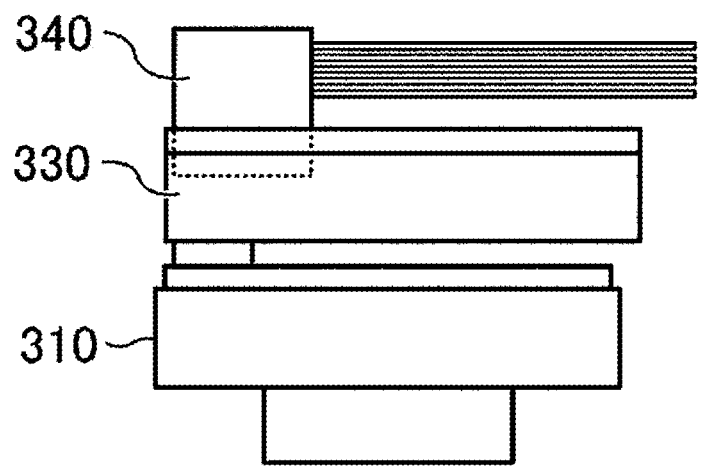

FIG. 10B
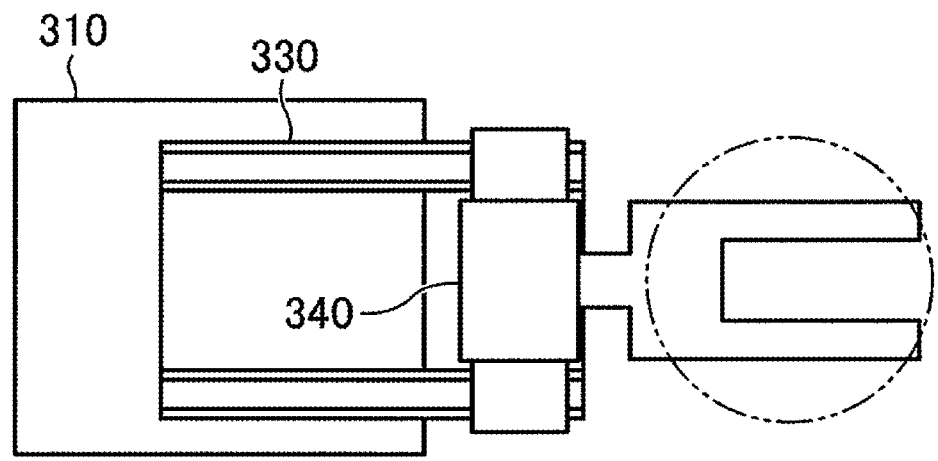
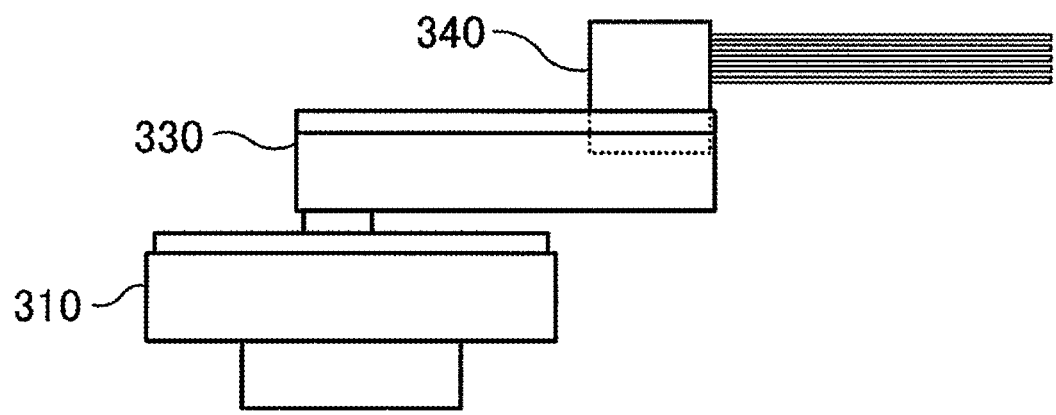

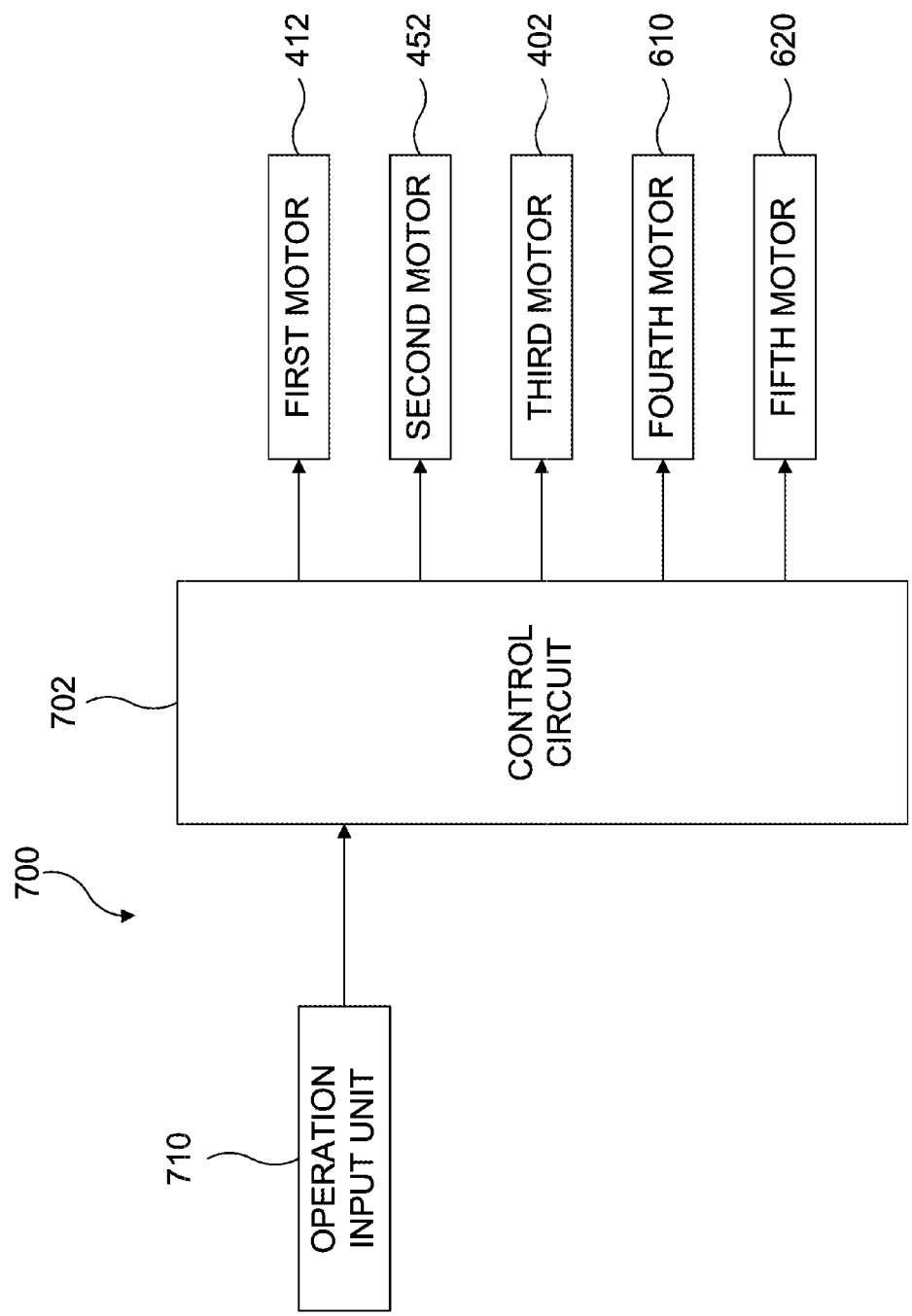

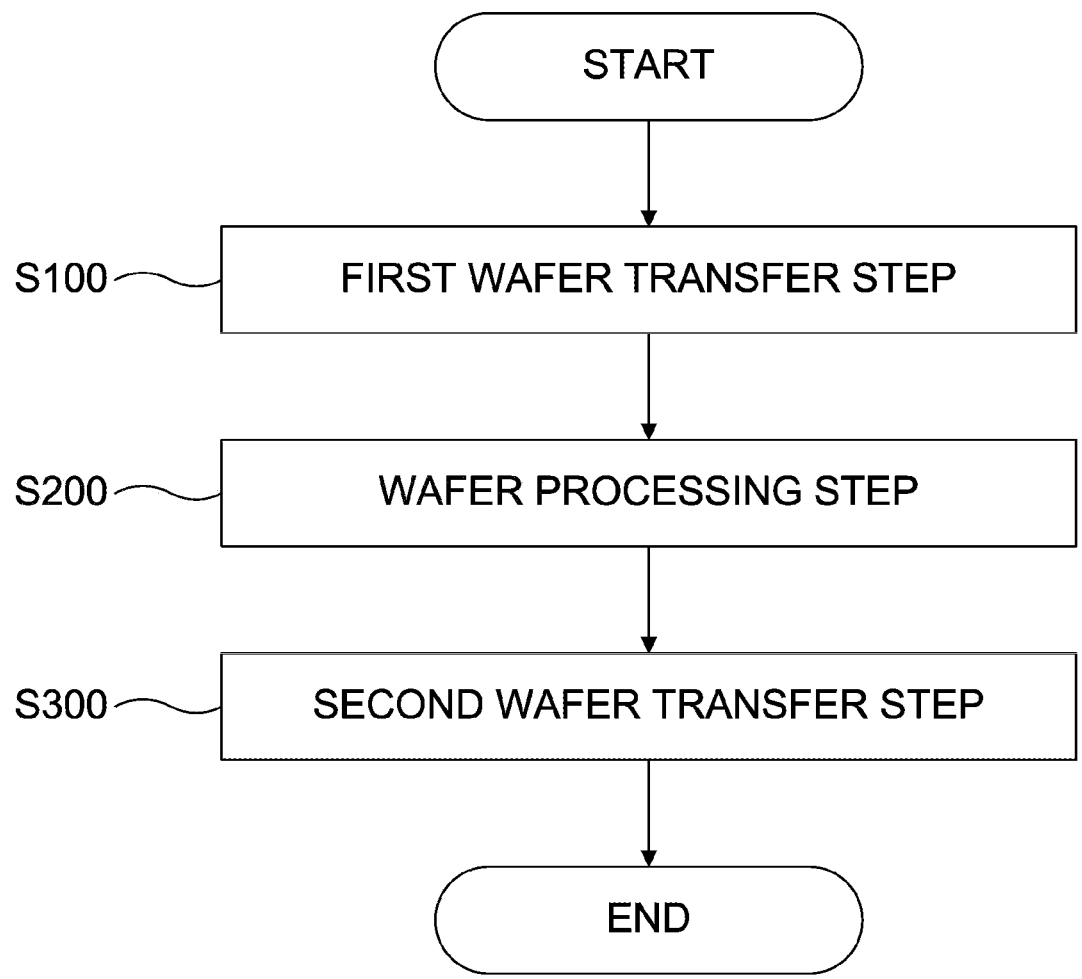

SUBSTRATE-PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2016/058508, filed on Mar. 17, 2016, in the WIPO, and Japanese Patent Application No. 2015-062658, filed on Mar. 25, 2015, in the Japanese Patent Office, the entire contents of which are hereby incorporated by reference.

BACKGROUND

1. Field

The present disclosure relates to a substrate processing apparatus and a method of manufacturing a semiconductor device.

2. Description of the Related Art

The process of manufacturing a semiconductor device may include, for example, a process of forming a predetermined film on a substrate. The substrate processing may be performed by a substrate processing apparatus. In the substrate processing apparatus, a substrate stored in a substrate container is transferred to a substrate retainer using a substrate transfer device and the substrate charged in the substrate retainer is processed in the process chamber.

A conventional substrate transfer device is only capable of transferring the substrate for a fixed distance. Therefore, the conventional substrate transfer device is not capable of transferring the substrate to two different locations of different distances.

SUMMARY

Described herein is a technique capable of transferring a substrate to a plurality of locations of different distances.

According to one aspect of the technique described herein, a substrate processing apparatus including: a process chamber where a substrate supported by a substrate retainer is processed; and a transfer device transferring the substrate to the substrate retainer, the transfer device including: a base capable of rotation by a third motor; a first moving unit moving linearly on the base; a first drive unit provided on the base and configured to drive the first moving unit, the first drive unit including: a first pulley group; a first belt wound on the first pulley group, a first motor coupled to and configured to drive a first pulley of the first pulley group; and a first connecting member coupling the first belt and the first moving unit; a second moving unit moving linearly on the first moving unit; a second drive unit provided in the first moving unit and configured to drive the second moving unit, the second drive unit including: a second motor to drive the second moving unit; and a bearer attached to the second moving unit and configured to support a substrate being transferred, wherein an enclosure of the first drive unit at least partially overlaps with an enclosure of the second drive unit in vertical direction, and motions of the first drive unit and the second drive unit are independently controlled.

BRIEF DESCRIPTION OF THE DRAWINGS

FIGS. 3A and 3B illustrate moving distances of a substrate by a substrate transfer device of the substrate processing apparatus illustrated in FIG. 1, wherein FIG. 3A illustrates a moving distance between substrate transfer device and a substrate container and FIG. 3B illustrates a moving distance between the substrate transfer device and a substrate retainer.

FIGS. 4A and 4B illustrate a structure of the substrate transfer device of the substrate processing apparatus of FIG. 1, wherein FIG. 4A is a plan view of the substrate transfer device and FIG. 4B is a left side view of the substrate transfer device.

FIGS. 10A and 10B are diagrams for describing an operation of the substrate transfer device illustrated in FIGS. 3A and 3B, wherein FIG. 10A illustrates the substrate transfer device in a first position and FIG. 10B illustrates the substrate transfer device in a second position.

FIG. 11 is a block diagram illustrating a controller of the substrate processing apparatus illustrated in FIG. 1.

FIG. 12 is a flowchart showing an operation of the substrate processing apparatus illustrated in FIG. 1.

FIGS. 13A and 13B illustrate main parts of a substrate transfer device according to a second embodiment, wherein FIG. 13A illustrates a mapping sensor in a sensing position and FIG. 13B illustrates the mapping sensor in a retracted position.

FIGS. 14A and 14B illustrate main parts of a substrate transfer device according to a comparative example, wherein FIG. 14A illustrates a mapping sensor in a sensing position and FIG. 14B illustrates the mapping sensor in a retracted position.

DETAILED DESCRIPTION

Figure 1:
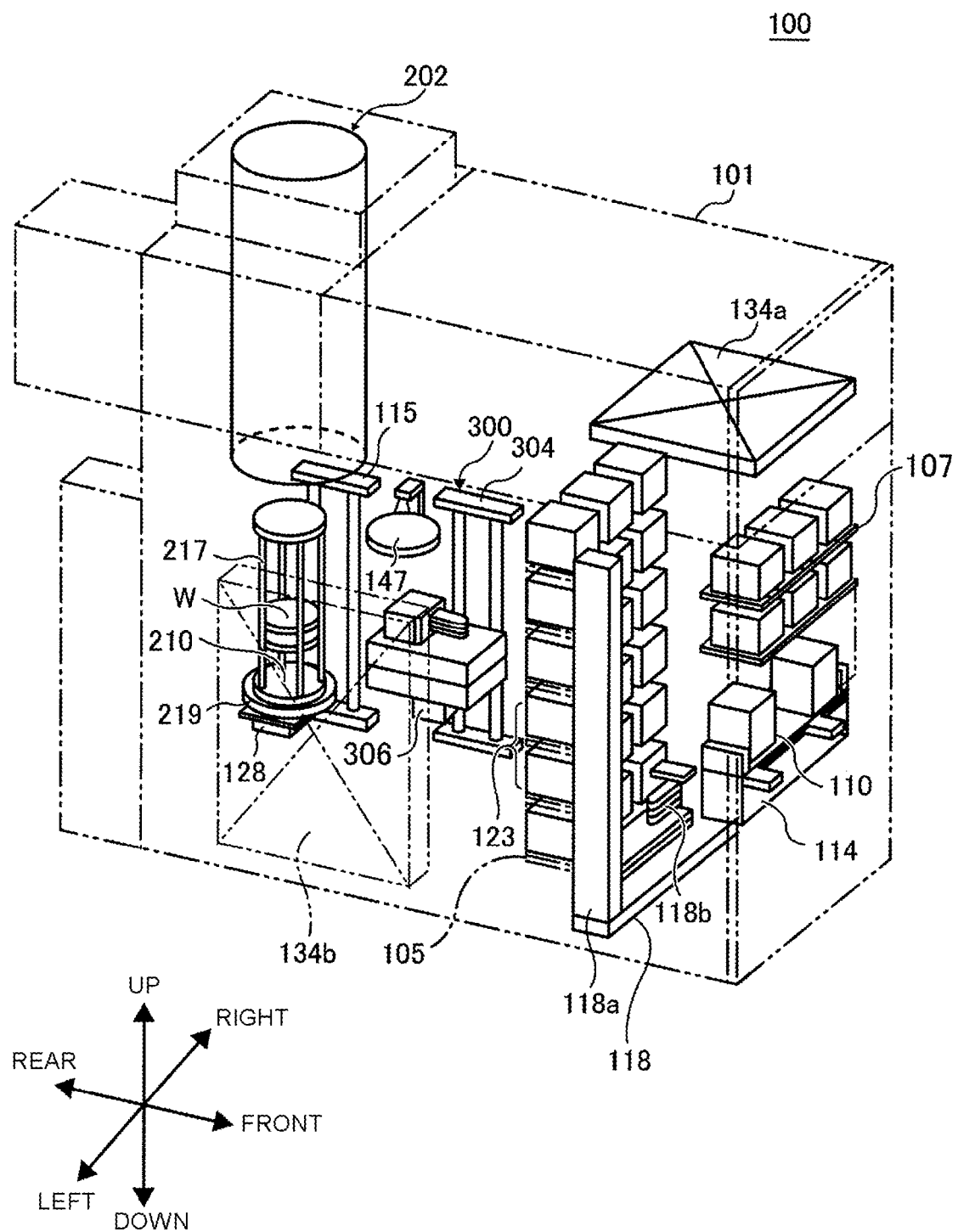
FIG. 1 is a perspective view of a substrate processing apparatus according to a first embodiment.

Next, a substrate processing apparatus according to a first embodiment will be described. While the technique is described by way of embodiments, the technique is not limited by the embodiments. Therefore, it is obvious to those skilled in the art to derive other embodiments in which all or some of elements of the embodiments in the following descriptions are replaced with equivalents, and the other embodiments are included in the scope of the technique. In the following descriptions, components having a like function among components illustrated in the respective drawings are represented by like reference numerals, and the duplicated descriptions thereof are omitted.

First Embodiment

Figure 2:
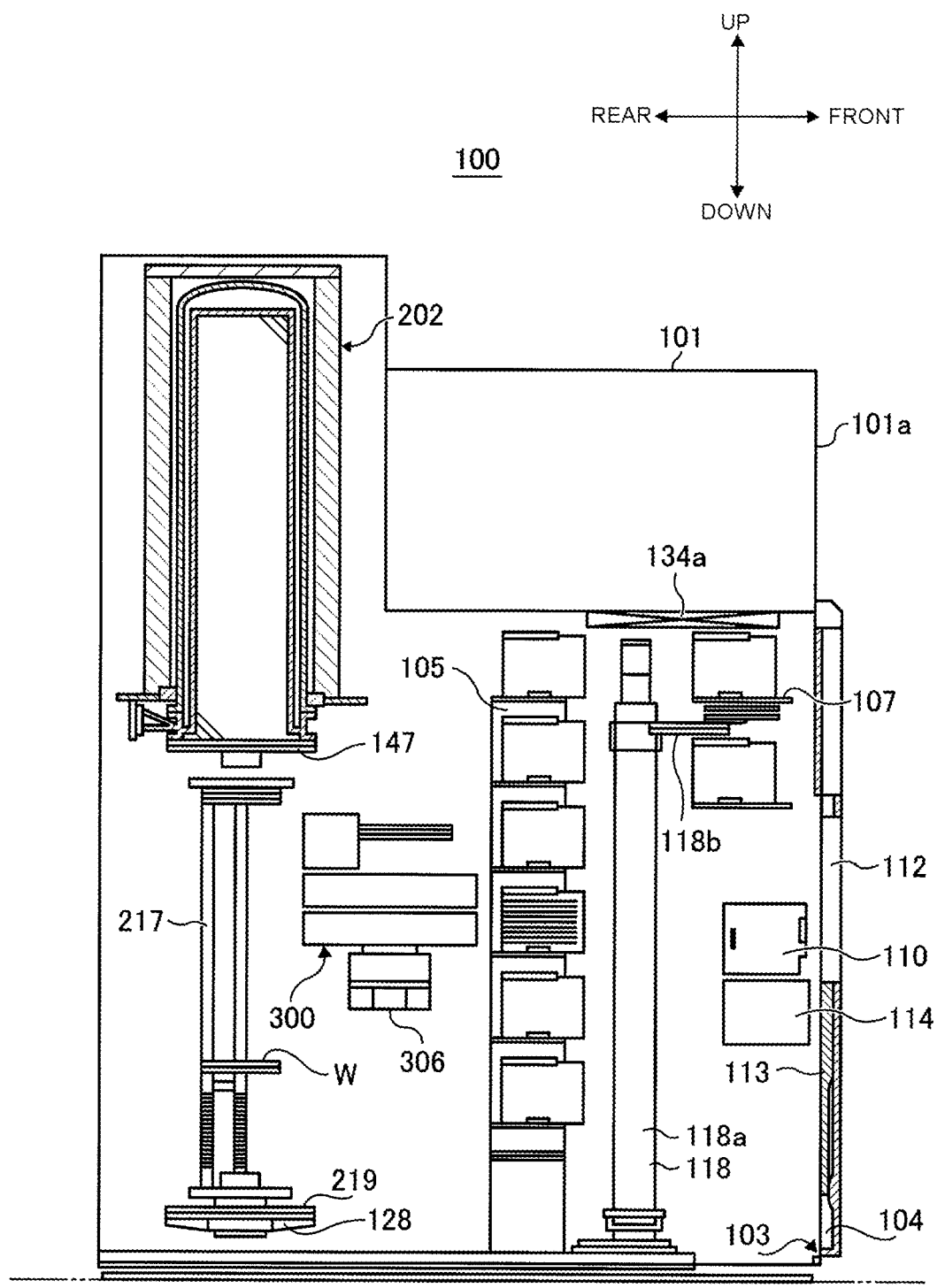
FIG. 2 is a left side view of the substrate processing apparatus illustrated in FIG. 1.

As illustrated in FIGS. 1 and 2, a substrate processing apparatus 100 processes a wafer W made of a material such as silicon. The substrate processing apparatus 100 is used as a semiconductor device manufacturing apparatus for manufacturing a semiconductor device such as an integrated circuit (IC). A substrate processing method (a method of manufacturing a semiconductor device) is performed by the substrate processing apparatus 100. The substrate processing apparatus 100 may be a vertical type heat treatment apparatus. The substrate processing apparatus 100 is capable of subjecting the wafer W to processes such as an oxidation process, a diffusion process and a chemical vapor deposition (CVD) process.

The substrate processing apparatus 100 includes a main unit 101. A front maintenance port 103 is provided at a front wall 101a of the main unit 101. A maintenance door 104 and a front opener 113, which open and close the front maintenance port 103, are provided at the front wall 101a. A pod loading/unloading port 112 is provided at the maintenance door 104 to connect the inside and outside of the main unit 101.

A shelf 105, a spare shelf 107, an I/O stage 114 which is a pod receiving base, a boat elevator 115 which is a substrate retainer elevating mechanism and a pod transfer device 118 are disposed in the main unit 101. A plurality of pods, which are substrate containers of the wafer W such as Front Opening Unified Pod (FOUP), Standard Mechanical Interface (SMIF) and an open cassette, are placed on the shelf 105. The pod transfer device 118 includes a pod elevating unit 118a and a pod transfer unit 118b. A wafer transfer device 300, which is a transfer shelf 123, is disposed in the main unit 101. The wafer transfer device 300 is also referred to as "substrate transfer device" or "transfer device". The pods 110, which are objects to be transferred by the transfer device 300, are placed on the transfer shelf 123.

A clean air unit 134a, a clean air unit 134b, a furnace opening shutter 147 serving as a furnace opening opening/closing unit, a processing furnace 202, a boat 217 serving as a substrate retainer, and a seal cap 219 are disposed in the main unit 101. The boat 217 is made of materials such as quartz and SiC.

The I/O stage 114 is disposed in the vicinity of the pod loading/unloading port 112. The pod 110 is loaded onto the I/O stage 114 or unloaded from the I/O stage 114 by a transfer device (not shown).

The pod transfer device 118 is installed between the I/O stage 114 and the shelf 105. The pod elevating unit 118a may move the pod 110 upward/downward while supporting the pod 110. The pod transfer unit 118b is installed on the pod elevating unit 118a. By consecutive operations of the pod elevating unit 118a, a robot arm (not shown) and the pod transfer unit 118b, the pod 110 is transferred among the I/O stage 114, the shelf 105 and the spare shelf 107.

The transfer device 300 is a sort of industrial robot and installed at the rear of the shelf 105. The transfer device 300 includes a rotary-linear motion mechanism 306 capable of horizontally rotating or linearly moving the wafer W and an elevating mechanism 304 for elevating the rotary-linear motion mechanism 306. By consecutive operations of the rotary-linear motion mechanism 306 and the elevating mechanism 304, the wafer W is charged into the boat 217 or discharged from the boat 217. The configuration of the transfer device 300 will be described later in more detail.

The boat elevator 115 includes an arm 128. The boat elevator 115 is disposed under the processing furnace 202, and functions as an elevating mechanism for elevating the boat 217 into the processing furnace 202. The seal cap 219 is installed parallel to the arm 128. The seal cap 219 may vertically support the boat 217, and open/close the lower end of the processing furnace 202.

The boat 217 includes a plurality of support members to concentrically support a plurality of wafers (for example, 25 to 150 wafers) which are arranged in multiple stages in the vertical direction.

The processing furnace 202 is disposed at the rear top region of the main unit 101. The lower end portion of the processing furnace 202 is opened and closed by the furnace opening shutter 147. The boat 217 may be loaded into the processing furnace 202 or unloaded from the processing furnace 202 by the boat elevator 115.

Figure 3A:
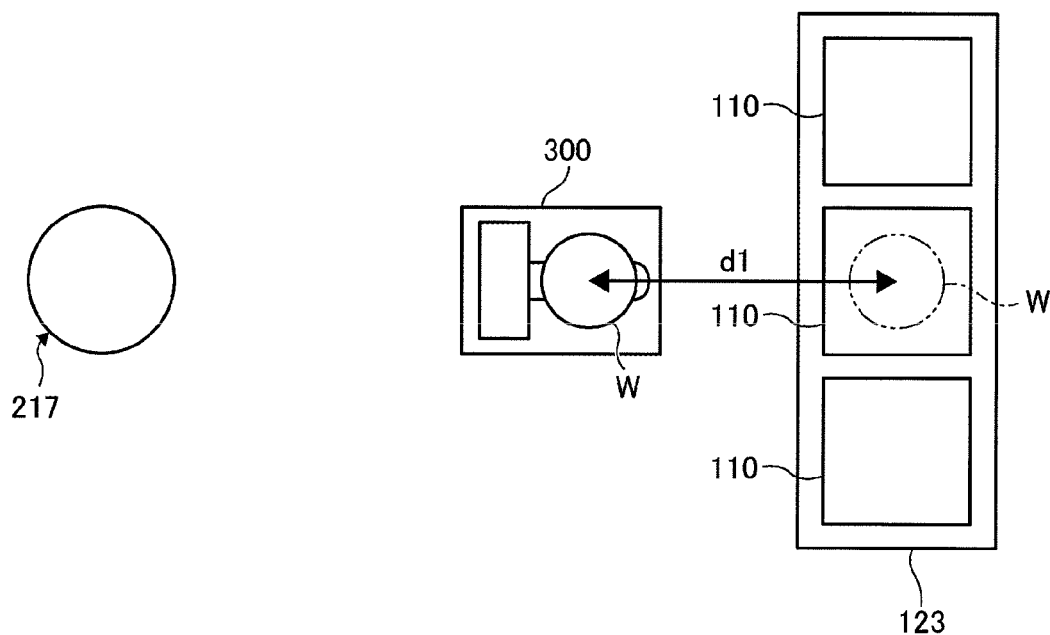
Figure 3B:
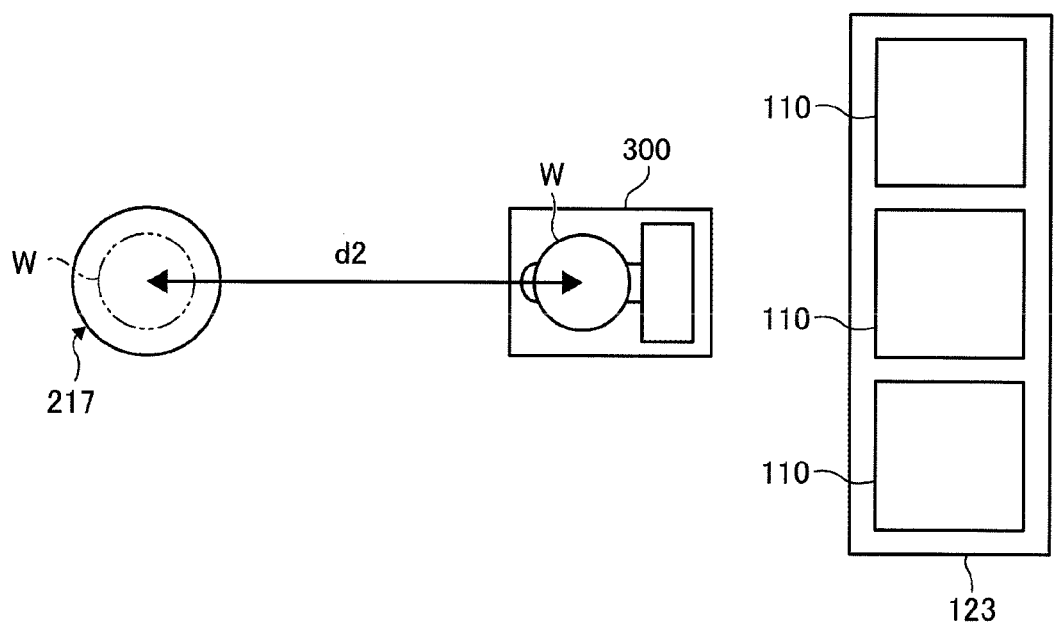

Next, a moving distance of the wafer W by the transfer device 300 according to the first embodiment will be described. As illustrated in FIGS. 3A and 3B, a moving distance d2 of the wafer W when the wafer W is transferred into the boat 217 is longer than a moving distance d1 of the wafer W when the wafer W is loaded into the pod 110 or unloaded from the pod 110. The transfer device 300 is provided on a straight line connecting the boat 217 and the pod 110.

A conventional transfer device (hereinafter, referred to as "comparative device") may move the wafer only by the same distance. Or the comparative device needs to extend fully its multi-joint arm to reach the wafer through a narrow transfer path. On the other hand, the transfer device 300 according to the first embodiment is capable of moving the wafer W between the pod 110 and the boat 217 which are located at different distances from the transfer device 300. Specifically, when the minimum distance between the transfer device 300 and the boat 217 is the distance d2, the transfer shelf 123 of the comparative device must be provided at a location spaced apart by the distance d2 from the transfer device 300. According to the first embodiment, however, the transfer shelf 123 may be provided at a location spaced apart by the distance d1 shorter than the distance d2 from the transfer device 300. Therefore, a substrate processing apparatus employing the comparative device has a larger size than the substrate processing apparatus employing the transfer device 300 according to the first embodiment. That is, according to the first embodiment, the substrate processing apparatus 100 may be reduced in size.

Figure 4A:
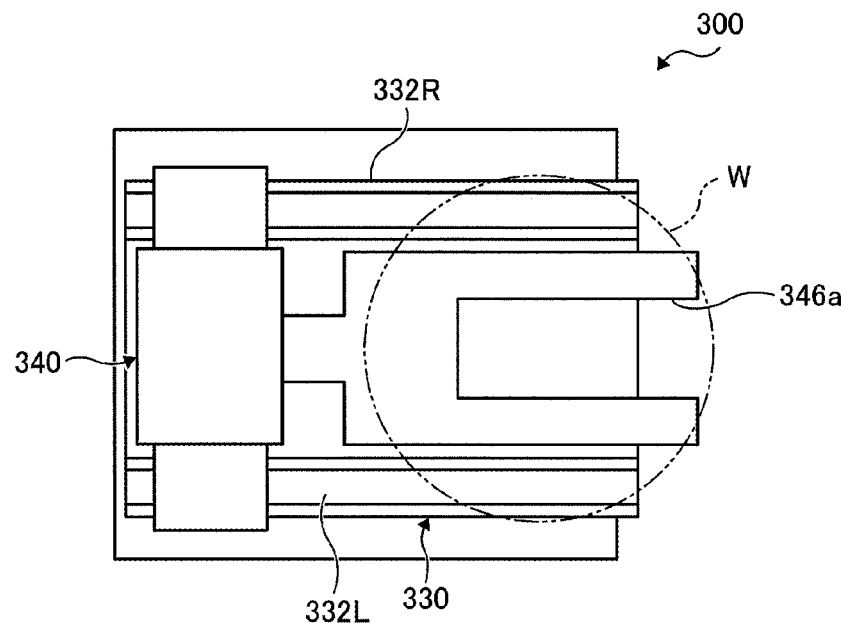
Figure 4B:
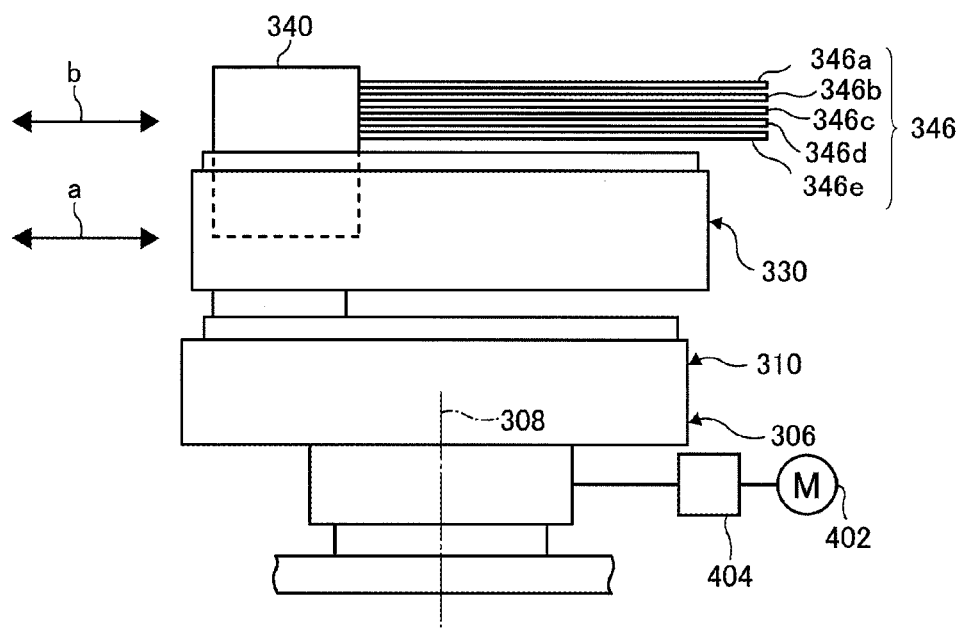

Next, the transfer device 300 according to the first embodiment will be described. FIGS. 4A and 4B illustrate only the rotary-linear motion mechanism 306 excluding the elevating mechanism 304. The rotary-linear motion mechanism 306 is moved upward/downward by the elevating mechanism 304.

As illustrated in FIGS. 4A and 4B, the rotary-linear motion mechanism 306 includes: a base 310 capable of rotating; a first moving unit 330 capable of moving relative to the base 310; and a second moving unit 340 capable of moving relative to the first moving unit 330.

The base 310 is coupled to a third motor 402 serving as a third drive source by a drive transmission mechanism 404 embodied by parts such as a series of gears. The base 310 is rotated about a rotational axis 308 by the third motor 402. By the rotation of the base 310, the first moving units 330 and the second moving units 340 are rotated about the rotational axis 308 together with the base 310.

By the operation of the elevating mechanism 304 (refer to FIG. 1), the first moving units 330 and the second moving units 340 are moved up and down. By the operation of the base 310, the first moving units 330 and the second moving units 340 are rotated. As indicated by an arrow "a" of FIG. 4B, the first moving unit 330 moves (advances/retreats) in the forward and backward direction (horizontal direction) relative to the base 310. The second moving unit 340 moves in the forward and backward direction (horizontal direction)

relative to the first moving unit 330, as indicated by an arrow "b" of FIG. 4B. The first moving units 330 and the second moving units 340 are moved forward and backward by drive mechanisms (see FIG. 5) which are described later. The first moving units 330 and the second moving units 340 constitute a two-stage extensible arm.

The second moving unit 340 includes a plurality of tweezers (end effectors) 346 serving as bearer on which the wafer W is placed, for example, five tweezers 346a and 346e. Each of the tweezers 346 is a plate-shaped member disposed in the substantially horizontal orientation, and vertically supports the wafer W from thereunder. The tweezers 346a through 346e are coupled to the second moving unit 340 with predetermined intervals therebetween.

Figure 5:
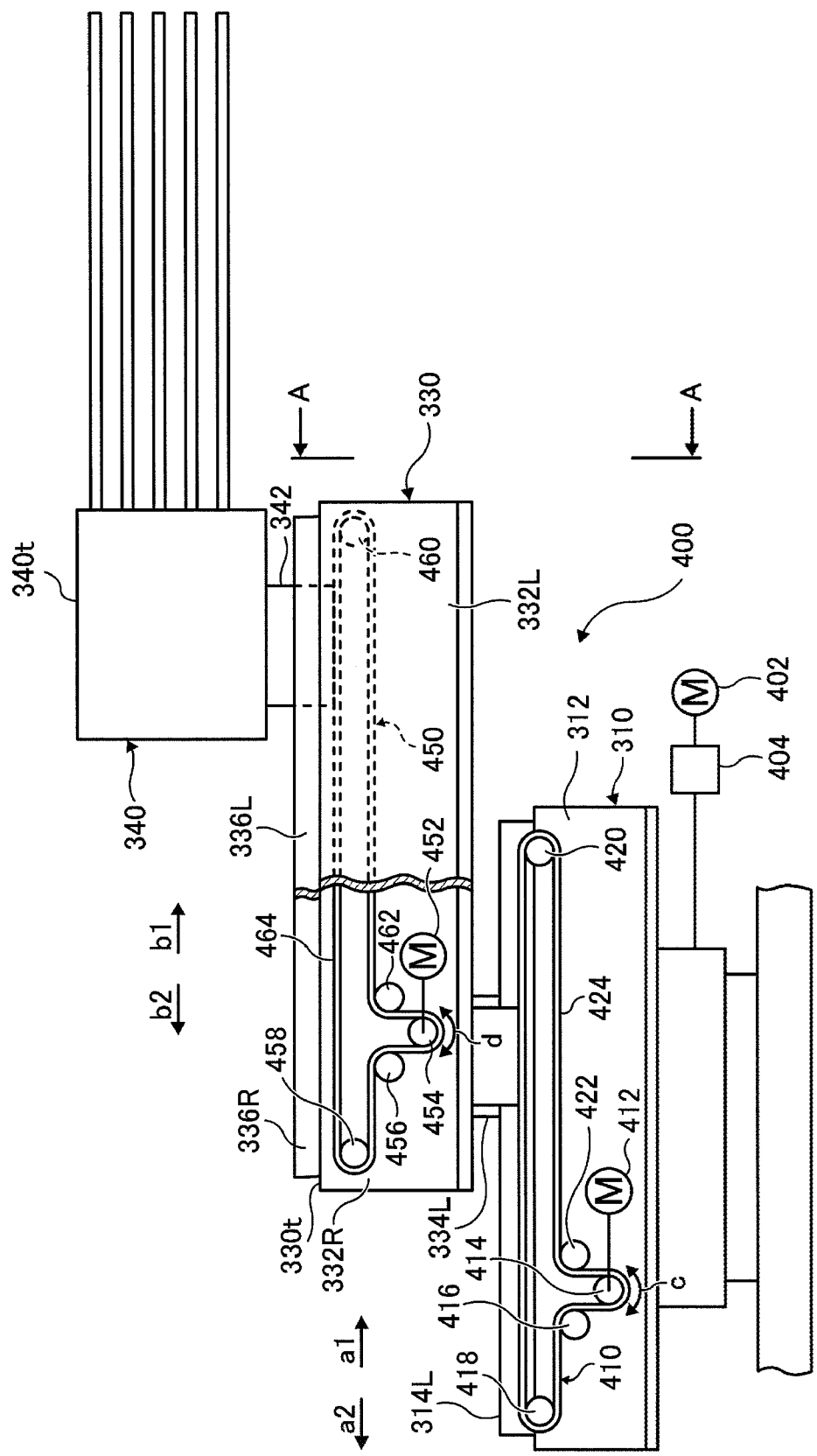
FIG. 5 is a left side view of a drive mechanism of the substrate transfer device illustrated in FIGS. 4A and 4B.
Figure 6:
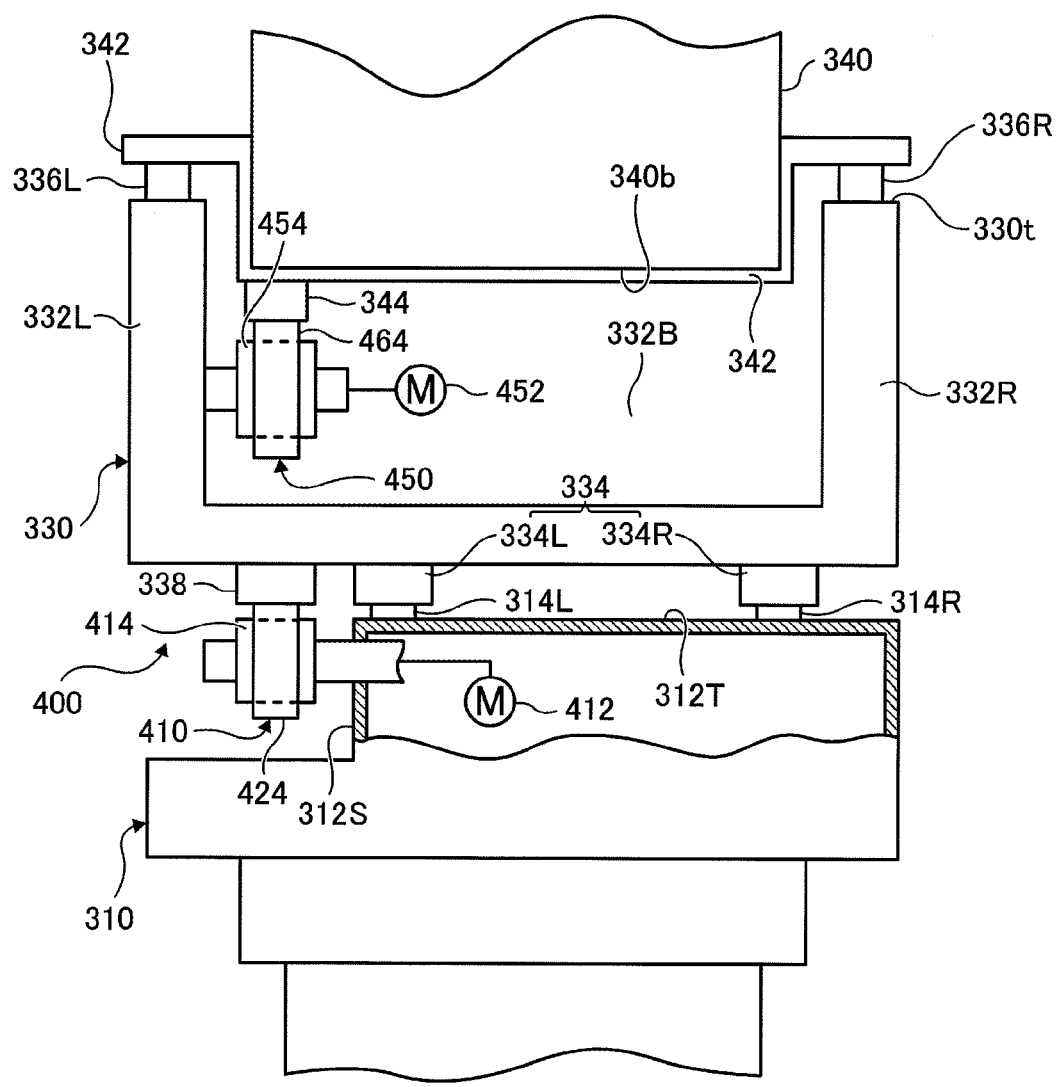
FIG. 6 illustrates the drive mechanism of the substrate transfer device illustrated in FIGS. 4A and 4B viewed from a direction indicated by an arrow a-A in FIG. 5.

As illustrated in FIGS. 5 and 6, the base 310 includes a side plate 312S as a portion of an enclosure of the base 310. The side plate 312S serves as an outer side surface of the base 310, and is parallel to arrows "a1" and "a2" indicating directions in which the first moving unit 330 moves.

The base 310 includes a top plate 312T as a part of the enclosure of the base 310. Rail members 314R and 314L are attached to the top surface of the top plate 312T. The rail members 314R and 314L may be used as a guide for guiding the first moving unit 330. The rail members 314R and 314L extend in parallel to the side plate 312s and in the directions in which the first moving unit 330 moves.

The first moving unit 330 includes a pair of side plates 332R and 332L and a bottom plate 332B, which constitute an enclosure of the first moving unit 330. The side plates 332R and 332L are parallel to arrows "b1" and "b2" indicating directions in which the second moving unit 340 moves. For example, the enclosure of the first moving unit 330 has a U-shaped cross-section formed by the side plates 332R and 332L and the bottom plate 332B, and includes a concave portion.

A connection member 334 is provided on the bottom surface of the bottom plate 332B of the first moving unit 330. The connection member 334 includes connection members 334R and 334L. The connection member 334R and the connection member 334L are movably provided on the rail members 314R and 314L, respectively such that the first moving unit 330 may move in the directions indicated by arrows "a1" and "a2" relative to the base 310.

The rail members 336R and 336L are mounted on the top surfaces of the side plates 332R and 332L of the first moving unit 330. The rail members 336R and 336L may be used as guide for guiding the second moving unit 340. The rail members 336R and 336L extend in the directions that the second moving unit 340 moves as indicated by the arrows "b1" and "b2".

The connection member 342 is fixed to the bottom surface of the second moving unit 340 (the surface of the lower end portion 340b). The connection member 342 extends from the bottom surface of the second moving unit 340 to both side surfaces of the second moving unit 340. That is, the connection member 342 is formed in a cap shape having ribs at both sides thereof, and has a U-shaped cross-section the upper end portions of which horizontally extend outward. Both ribs are movably provided on the respective rail members 336R and 336L such that the second moving unit 340 may move in the directions indicated by the arrows "b1" and "b2" relative to the first moving unit 330.

The lower end portion 340b of the second moving unit 340 is disposed lower than the upper end portion 330t of the first moving unit 330. That is, the second moving unit 340 is disposed in the concave portion of the first moving unit 330. In other words, at least a portion of the connection member 342 overlaps the side plates 332R and 332L in the horizontal direction. Since the lower end portion 340b of the second moving unit 340 is lower than the upper end portion 330t of the first moving unit 330, the transfer device 300 according to the first embodiment may have a smaller height than the conventional transfer device.

A drive mechanism 400 is a part of the rotary-linear motion mechanism 306, and linearly moves the wafer W. Specifically, the drive mechanism 400 moves the first moving unit 330 relative to the base 310, and moves the second moving unit 340 relative to the first moving unit 330.

The drive mechanism 400 includes a first drive unit 410 to move the first moving unit 330 relative to the base 310 and a second drive unit 450 to move the second moving unit 340 relative to the first moving unit 330. The first drive unit 410 is provided on the outer surface of the side plate 312S of the base 310, and the second drive unit 450 is provided on a surface (inner surface) facing the side plate 332R, among the surfaces of the side plate 332L of the first moving unit 330. That is, the first drive unit 410 is provided outside the enclosure of the base 310, and the second drive unit 450 is provided in the first moving unit 330.

The width of the first moving unit 330 is larger than the width of the second moving unit 340, i.e. the width of the lower end portion 340b of the second moving unit 340. The first drive unit 410 and the second drive unit 450 are disposed in such a manner that at least a portion of the first drive unit 410 and at least a portion of the second drive unit 450 overlap each other in the vertical direction. Specifically, the first drive unit 410 is located under the second drive unit 450 such that at least a portion of the first drive unit 410 and at least a portion of the second drive unit 450 overlap each other in the vertical direction.

The first drive unit 410 includes a first motor 412 to drive a drive pulley 414, and the second drive unit 450 includes a second motor 452 to drive a drive pulley 454. The first motor 412 is mounted in the base 310, and the second motor 452 is mounted in the first moving unit 330.

The first drive unit 410 includes the drive pulley 414. The drive pulley 414 may be provided at the side plate 312S, and is rotated by the first motor 412 in directions indicated by an arrow "c" of FIG. 5. The first drive unit 410 includes secondary pulleys 416, 418, 420 and 422. The secondary pulleys 416, 418, 420 and 422 are rotatably provided at the side plate 312S.

The first drive unit 410 includes a belt member 424. The belt member 424 includes an endless belt. As illustrated in FIG. 5, the belt member 424 is wound around the drive pulley 414 and the secondary pulleys 416, 418, 420 and 422. The belt member 424 receives power transmitted from the drive pulley 414, and rotates the secondary pulleys 416, 418, 420 and 422. A fixing member 338 provided on the bottom surface of the first moving unit 330 is fastened to the belt member 424. That is, the belt member 424 and the first moving unit 330 are coupled and fixed by the fixing member 338. When the belt member 424 is driven, the first moving unit 330 is moved.

The second drive unit 450 includes the drive pulley 454. The drive pulley 454 may be provided at the side plate 332L, and is rotated by the second motor 452 in directions indicated by an arrow "d" of FIG. 5. The second drive unit 450 includes secondary pulleys 456, 458, 460 and 462. The secondary pulleys 456, 458, 460 and 462 are rotatably provided at the side plate 332L.

The second drive unit 450 includes a belt member 464. The belt member 464 includes an endless belt. As illustrated in FIG. 5, the belt member 464 is wound around the drive pulley 454 and the secondary pulleys 456, 458, 460 and 462. The belt member 464 receives power transmitted from the drive pulley 454, and rotates the secondary pulleys 456, 458, 460 and 462. A fixing member 344 provided on the bottom surface of the connection member 342 is fastened to the belt member 464. That is, the belt member 464 and the second moving unit 340 are coupled and fixed by the fixing member 344. When the belt member 464 is driven, the second moving unit 340 is moved.

As described above, the drive mechanism 400 moves the first moving unit 330 in the forward direction indicated by the arrow "a1" or the backward direction indicated by the arrow "a2" as the first motor 412 rotates the drive pulley 414, and the drive pulley 414 drives the belt member 424. At this time, the rotation direction of the first motor 412 may be switched to move the first moving unit 330 in the forward direction or the backward direction.

The drive mechanism 400 moves the second moving unit 340 in the forward direction or the backward direction as the second motor 452 rotates the drive pulley 454 to drive the belt member 464. At this time, the rotation direction of the second motor 452 may be switched to move the second moving unit 340 in the forward direction or the backward direction. The first moving unit 330 and the second moving unit 340 may be moved independently of each other. Since the velocities of the first moving units 330 and the second moving units 340 may be independently controlled, the transfer velocity of the substrate may be improved and the throughput is improved as well. When the first moving units 330 and the second moving units 340 are simultaneously accelerated or decelerated in the same direction, the acceleration of the first moving unit 330 needs to be reduced more than when only the first moving unit 330 is operated since the first moving unit 330 has a larger inertia.

Figure 7:
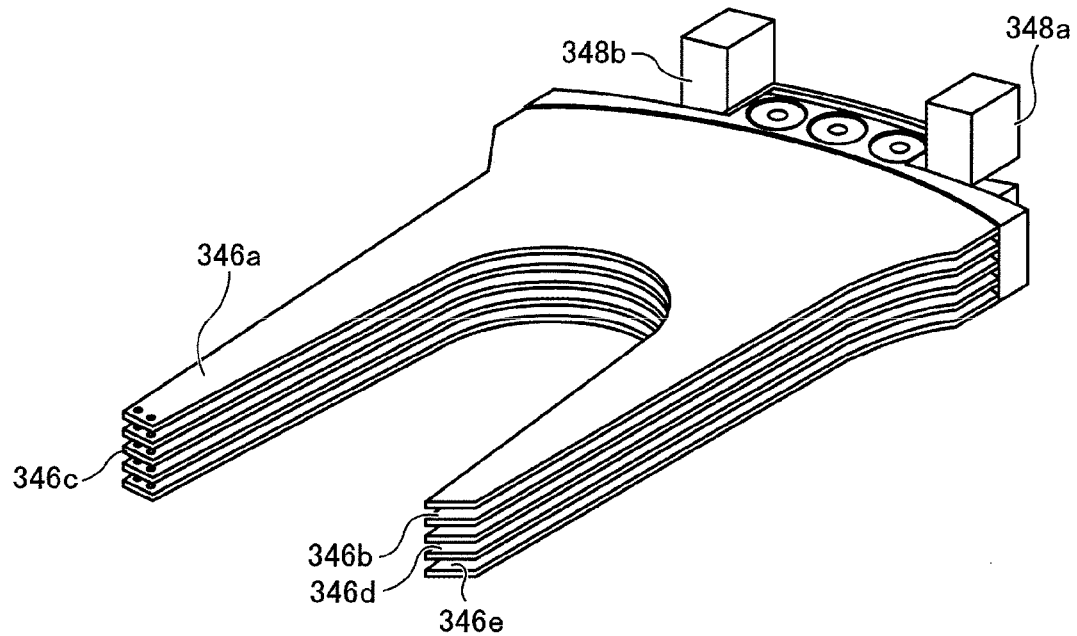
FIG. 7 is a perspective view illustrating tweezers of the substrate transfer device illustrated in FIGS. 4A and 4B, on which substrates are placed.
Figure 8:
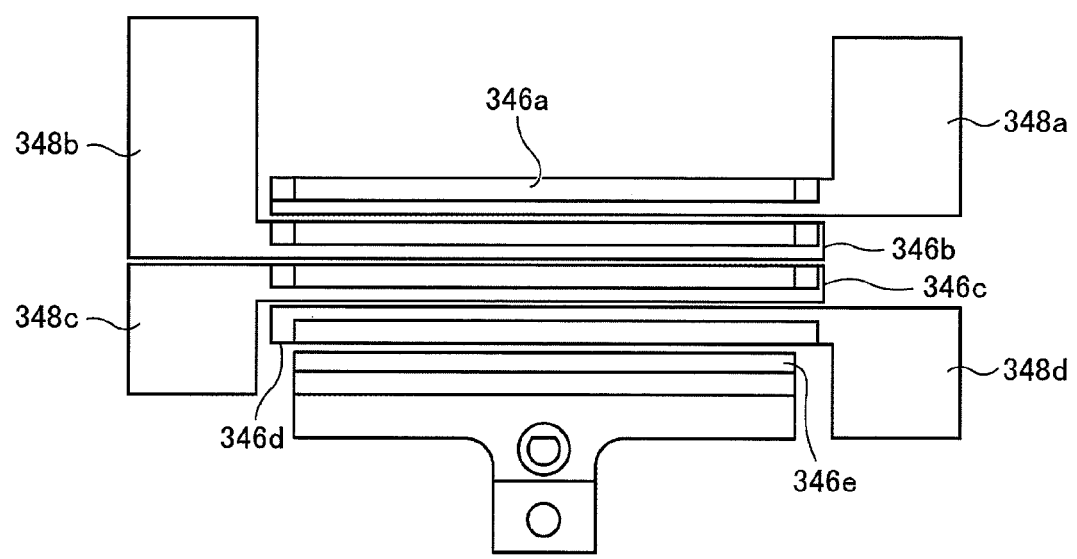
FIG. 8 is a front view of the tweezers illustrated in FIG. 7.

Next, the tweezers 346 according to the first embodiment, for example, the tweezers 346a through 346d will be described with reference to FIGS. 7 and 8. The tweezers 346 are made of SUS, for example. When the tweezers 346 are made of SUS, it is possible to suppress a deflection caused by the weight of the tweezers 346, compared to when the tweezers 346 are made of aluminum.

The tweezers 346a through 346d may be mounted on a moving mechanism 600 (illustrated in FIG. 9) which is described later, and vertically moved by an operation of the moving mechanism 600. The tweezers 346a through 346d are mounted on the moving mechanism 600 through mounts 348a through 348d.

The mounts of tweezers adjacent to each other among the tweezers 346a through 346d face each other in the horizontal or vertical direction.

Specifically, the mounts 348a and 348b of the two adjacent tweezers 346a and 346b are horizontally at opposite to each other. The mounts 348b and 348c of the two adjacent tweezers 346b and 346c are vertically at opposite to each other. The mounts 348c and 348d of the two adjacent tweezers 346c and 346d are horizontally at opposite to each other.

Figure 9:
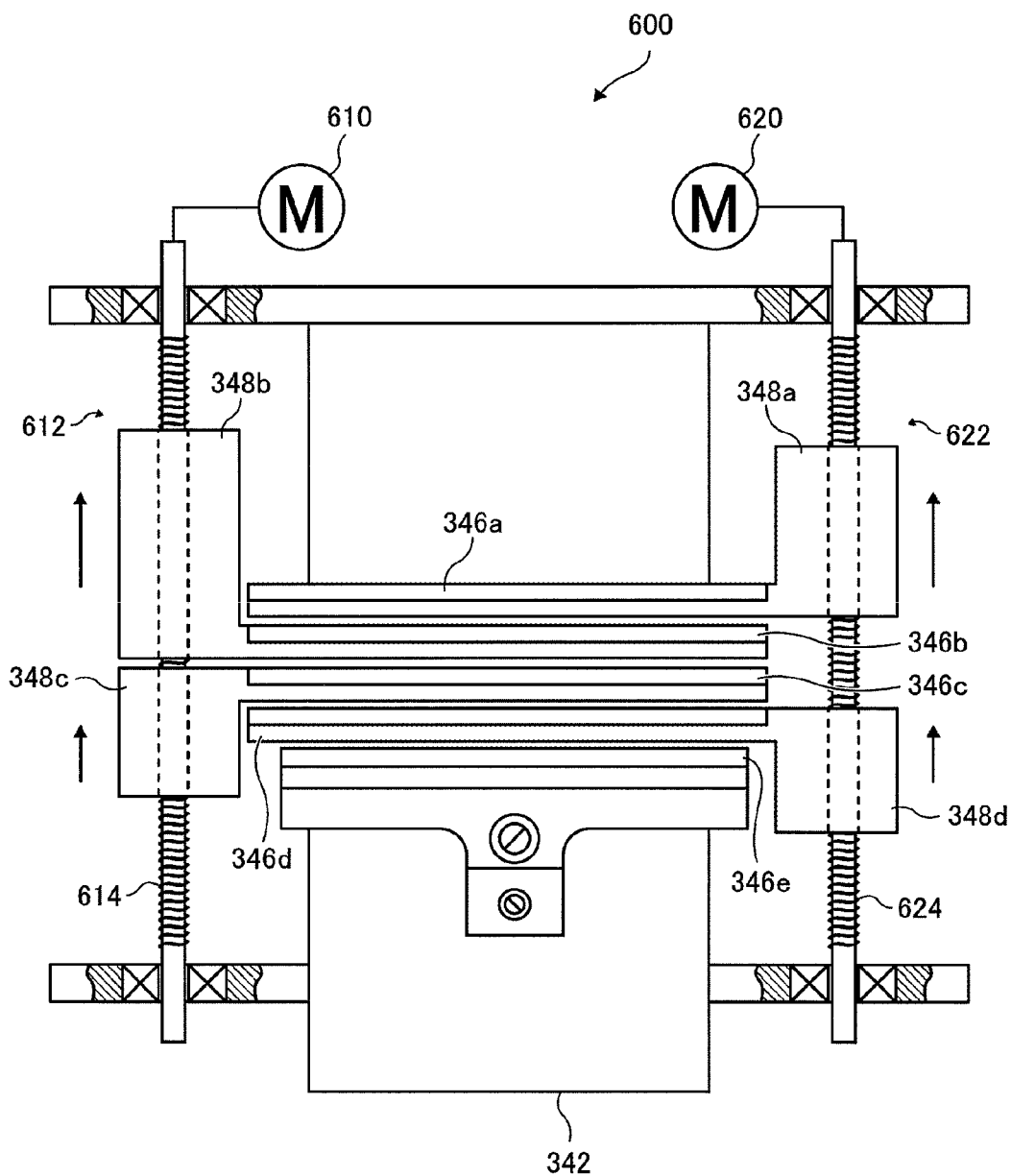
FIG. 9 illustrates a moving mechanism for vertically moving the tweezers illustrated in FIG. 7.

Next, the moving mechanism 600 will be described. As illustrated in FIG. 9, the moving mechanism 600 includes a ball screw mechanism 612 driven by a fourth motor 610 and a ball screw mechanism 622 driven by a fifth motor 620. The mounts 348b and 348c are provided on a screw member 614 of the ball screw mechanism 612. The mounts 348a and 348d are provided on a screw member 624 of the ball screw mechanism 622.

Since the ball screw mechanisms 612 and 622 of the moving mechanism 600 are driven synchronously, the tweezers 346a through 346d are also driven synchronously. A distance between any two adjacent tweezers among the tweezers 346a through 346d is determined by the moving velocities of the tweezers 346a through 346d by the ball screw mechanisms 612 and 622.

FIG. 9 illustrates a state in which the distance between adjacent tweezers is at the minimum. By moving the four tweezers 346a through 346d upward, the distance between adjacent tweezers is increased. For example, when the moving velocity of the tweezers 346d is set to V, the moving velocity of the tweezers 346c is 2V, the moving velocity of the tweezers 346b is 3V, and the moving velocity of the tweezers 346a is 4V. That is, the pitches of screw grooves formed in the mounts 348a through 348d have the following relation. When the pitch of the mount 348d is set to D, the pitch of the mount 348c is 2 D, the pitch of the mount 348b is 3 D, and the pitch of the mount 348a is 4 D. The tweezers 346e is not moved in the vertical direction.

Next, the advancing/retreating operation of the transfer device 300 will be described. FIG. 10A illustrates the first moving unit 330 in the rearmost position with respect to the base 310 and the second moving unit 340 in the rearmost position with respect to the first moving unit 330. FIG. 10B illustrates the first moving unit 330 in the intermediate position of the movable range with respect to the base 310 and the second moving unit 340 in the foremost position with respect to the first moving unit 330. The first moving unit 330 and the second moving unit 340 are moved with respect to the base 310 and the first moving unit 330, respectively, by the drive mechanism 400.

As illustrated in FIG. 11, a controller 700 includes a control circuit 702 embodied by parts such as a CPU. The control circuit 702 receives an input through an operation input unit 710 embodied by components such as an operation panel and an operation terminal device, for example. The first motor 412, the second motor 452, the third motor 402, the fourth motor 610 and the fifth motor 620 are controlled by the control circuit 702. That is, timings at which the first to fifth motors start to be rotated and are stopped and the rotational velocities of the first to fifth motors are controlled by the control circuit 702.

The control circuit 702 controls the first motor 412, the second motor 452, the third motor 402, the fourth motor 610 and the fifth motor 620. The control circuit 702 may control other components of the substrate processing apparatus 100, such as the boat elevator 115, the transfer device 118 and the elevating mechanism 304.

Next, an exemplary sequence of a process for forming a film on a wafer, which is one of processes for manufacturing a semiconductor device using the above-described substrate processing apparatus 100, will be described. Hereinafter, the process will be also referred to as a film forming process or substrate processing. In the following descriptions, the components of the substrate processing apparatus 100 are controlled by the controller 700. When a series of processes are started as illustrated in FIG. 12, the controller 700 controls the components of the substrate processing apparatus 100 to perform a first wafer transfer step S100, a wafer processing step S200 and a second wafer transfer step S300.

Before performing the first wafer transfer step S100, the pod 110 loaded through the pod loading/unloading port 112 is transferred to the transfer shelf 123 by the pod transfer device 118. The lid of the pod 110 transferred to the transfer shelf 123 is opened by a pod opener (not shown).

In the first wafer transfer step S100, the controller 700 controls the wafer transfer device 300 by controlling components such as the first motor 412, the second motor 452, the third motor 402 and the elevating mechanism 304 to transfer the wafer W in the pod 110 to the boat 217. That is, the wafer transfer device 300 is vertically or horizontally moved to transfer the wafer W in the pod 110 to the boat 217. The operation of transferring the wafer W to the boat 217 is performed until the number of wafers W transferred to the boat 217 reaches a predetermined number. For example, the wafers W from the plurality of pods 110 may be transferred to the boat 217. When the predetermined number of wafers W is transferred to the boat 217, the boat elevator 115 lifts the boat 217 to load the boat 217 into the processing furnace 202. Specifically, the furnace opening shutter 147 is opened to open the lower end portion of the processing furnace 202, and the seal cap 219 is lifted by the boat elevator 115, in order to load the boat 217 into the processing furnace 202.

Next, the wafers W contained in the boat 217 are processed in the processing furnace 202 in the wafer processing step S200. Specifically, a processing gas is supplied into the processing furnace 202 to subject the wafers W to a desired film-forming process.

Next, in the second wafer transfer step S300, the controller 700 controls the components of the substrate processing apparatus 100 to transfer the processed wafer W from the boat 217 to the pod 110. Specifically, after the wafers W are processed in the processing furnace 202, the boat elevator 115 lowers the seal cap 219 to unload the boat 217 from the processing furnace 202. The processed wafers W contained in the boat 217 is cooled to a predetermined temperature, and then transferred to the pod 110 from the boat 217 by the wafer transfer device 300. The pod 110 is unloaded from the substrate processing apparatus 100 in the opposite sequence of the above-described loading sequence.

In the first and second wafer transfer steps S100 and S300, the control circuit 702 controls the first moving units 330 and the second moving units 340 to move independently of each other and controls the first moving units 330 and the second moving units 340 to transfer the wafer W between the boat 217 and the pod 110 which are located at different distances from the wafer transfer device 300.

Second Embodiment

Figure 13A:
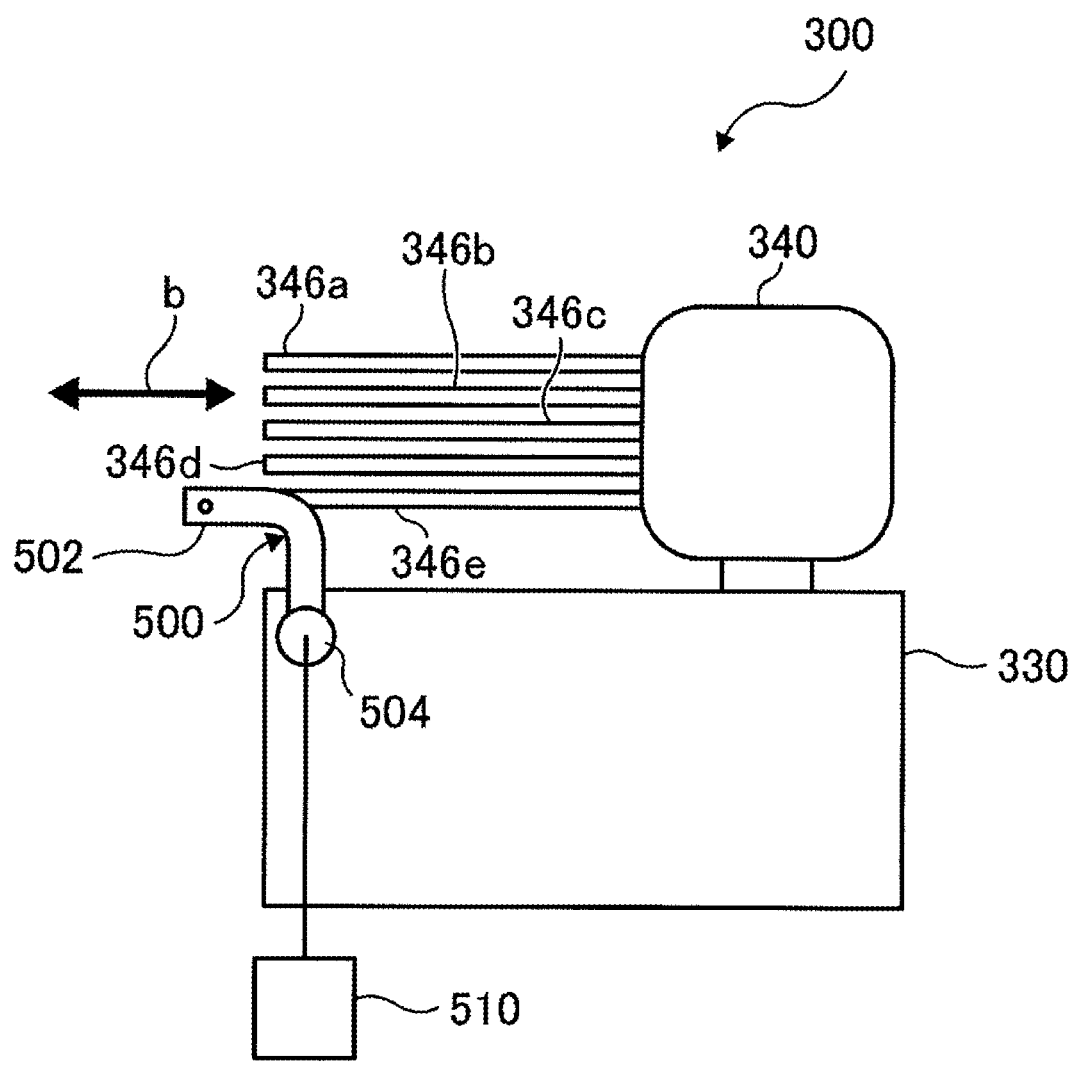
Figure 13B:
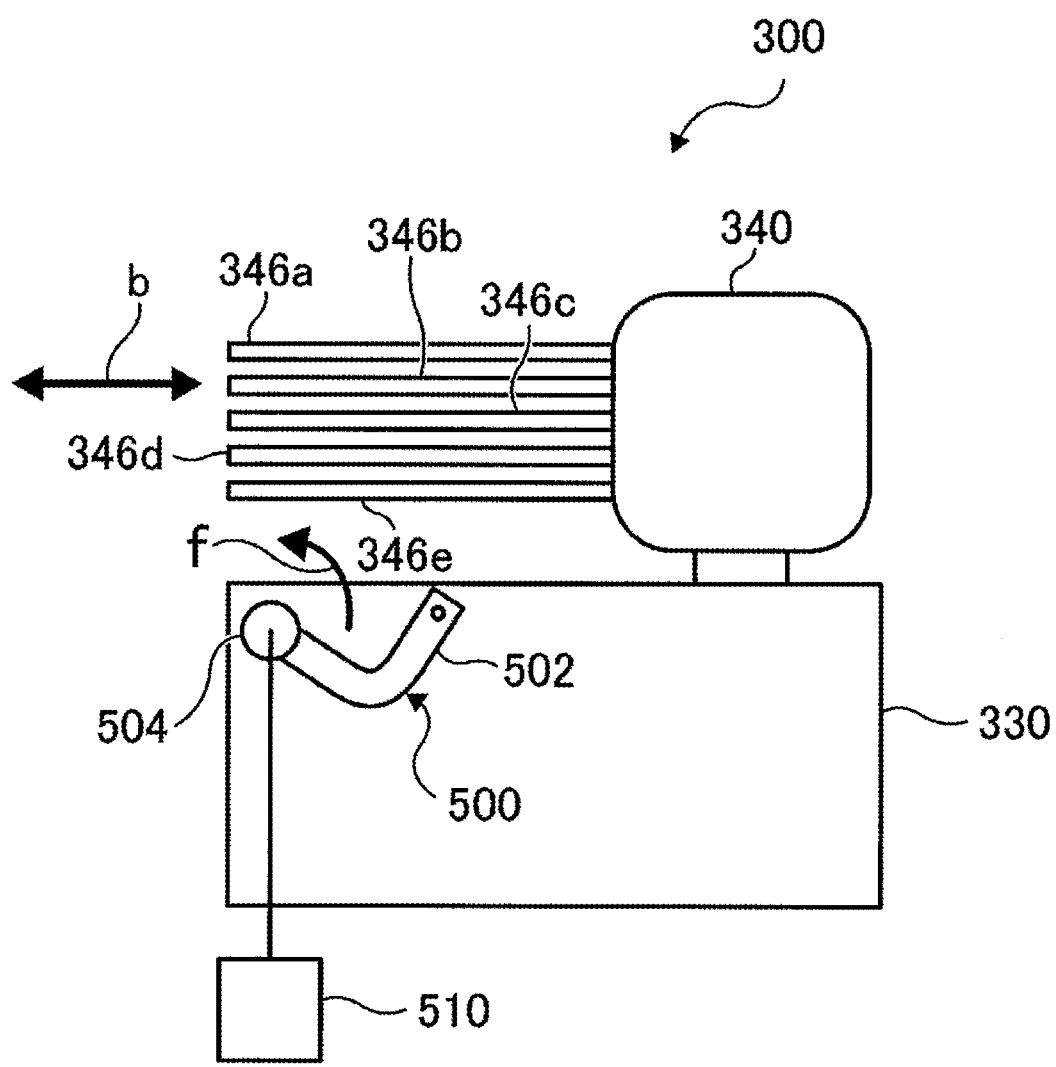

Next, a second embodiment will be described. As illustrated in FIGS. 13A and 13B, a transfer device 300 according to a second embodiment includes a mapping sensor 500 serving as a detecting unit. The mapping sensor 500 is a sensor for checking the wafer W in the pod 110, for example. Specifically, the mapping sensor 500 senses the number of wafers W in the pod 110 or senses whether the wafer W has been damaged. As the mapping sensor 500, a pair of optical fiber sensors that detects interception of light beam therebetween may be used. The mapping sensor 500 is provided on a side surface of the first moving unit 330. Specifically, the mapping sensor 500 is provided at the front end portion of the side surface of the first moving unit 330, in order to sense the wafer W when the second moving unit 340 is in motion along the direction indicated by the arrow b.

The mapping sensor 500 includes an L-shaped main body 502 and a rotating shaft 504. The main body 502 is rotated about the rotating shaft 504 with respect to the second moving unit 340. The rotation of the main body 502 may move the mapping sensor 500 between a sensing position illustrated in FIG. 13A and a retracted position illustrated in FIG. 13B. In the second embodiment, the sensing position is where the mapping sensor 500 senses the wafer W. The retracted position is where the mapping sensor 500 is stored when the mapping sensor 500 is not used. The level of the mapping sensor 500 (the level of the main body) in the sensing position is equal to the level of the front surface or the back surface of the wafer W placed on the tweezers 346, for example, the tweezers 346e. In the second embodiment, the level of the mapping sensor 500 is equal to the level of the surface of the tweezers 346e.

A rotary mechanism 510 is coupled to the mapping sensor 500. As the main body 502 is rotated about the rotating shaft 504 by the rotary mechanism 510, the mapping sensor 500 may be switched between the sensing position and the retracted position. By rotating the main body 502 in the direction of an arrow "f" illustrated in FIG. 13B, the mapping sensor 500 is moved from the retracted position to the sensing position.

When the mapping sensor 500 is in the sensing position, the mapping sensor 500 is disposed on the movement locus of the wafer W when the wafer W is transferred. Therefore, after the mapping sensor 500 checked the wafer W in the pod 110, it is possible to check the transfer state of the wafer W, without moving the mapping sensor 500.

Figure 14A:
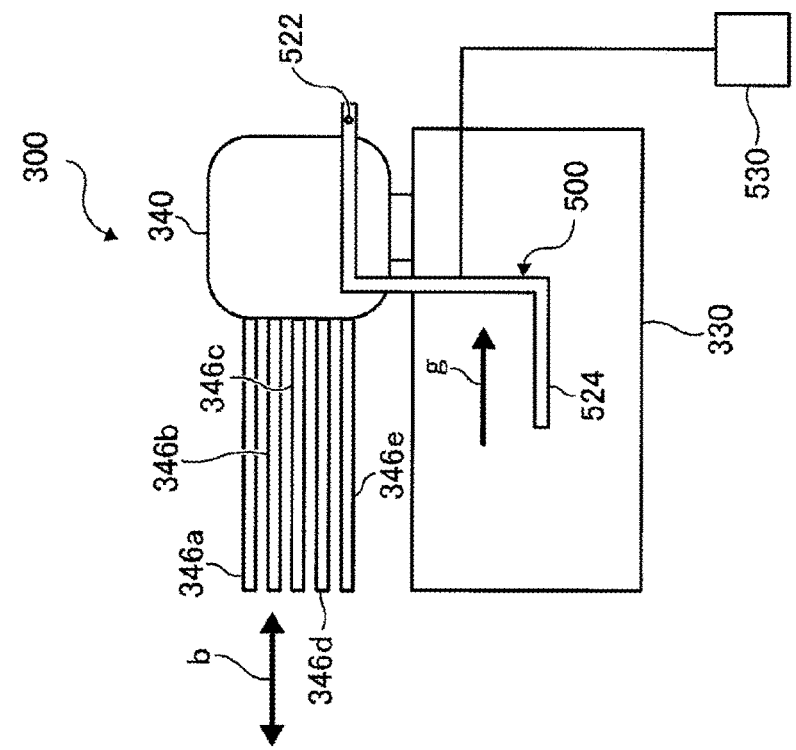
Figure 14B:
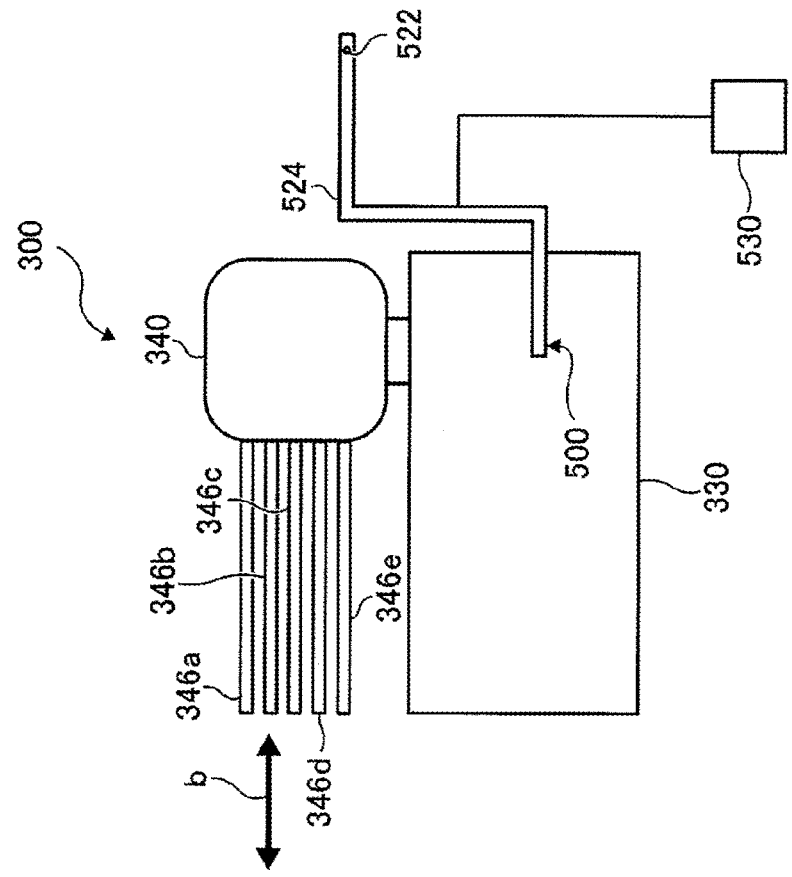

FIGS. 14A and 14B illustrate a transfer device 300 according to a comparative example of the second embodiment. The mapping sensor 500 according to the comparative example includes a sensing unit 522 to sense the wafer W and a frame 524 to support the sensing unit 522. A linear motion mechanism 530 is coupled to the frame 524. The mapping sensor 500 of the transfer device 300 according to the comparative example is linearly moved between a retracted position illustrated in FIG. 14A and a sensing position illustrated in FIG. 14B by the linear motion mechanism 530.

In order to avoid interference with the second moving unit 340, the mapping sensor 500 of the transfer device 300 according to the comparative example has a U-shaped structure wider than the second moving unit 340, when seen from the top. Thus, when the transfer device 300 according to the comparative example is in motion, the interference with the second moving unit 340 is avoided. As a result, since the frame 524 is wide, the frame 534 may be easily curved or bent by the weight thereof. When the frame 524 is curved or bent, the sensing unit 522 cannot be accurately positioned.

In the transfer device 300 according to the comparative example, the sensing position of the sensing unit 522 of the mapping sensor 500 does not coincide with the movement locus of the wafer W when the wafer W is in motion. Thus, after checking the wafer W of the pod 110, the mapping sensor 500 needs to be moved in order to check the transfer state of the wafer W.

When the wafer W is sensed, the transfer device 300 according to the comparative example needs to be rotated to control the mapping sensor 500 to face the wafer W. When the transfer device 300 is rotated whenever the wafer W is sensed, particles are highly likely to occur from the drive unit of the transfer device 300. Furthermore, since a time is required for the rotation, the throughput may be degraded.

The transfer device 300 according to the second embodiment may improve the sensing precision of the mapping sensor 500, compared to the transfer device 300 according to the comparative example.

According to the above-described technique, it is possible to transfer a substrate among a plurality of places which are located at different distances from the substrate transfer device.

What is claimed is:

1. A substrate processing apparatus comprising:
a process chamber where a substrate supported by a substrate retainer is processed; and
a transfer device transferring the substrate to the substrate retainer, the transfer device comprising:
a base capable of rotation by a third motor;
a first moving unit moving linearly on the base;
a first drive unit provided on the base and configured to drive the first moving unit, the first drive unit comprising: a first pulley group; a first belt wound on the first pulley group, a first motor coupled to and configured to drive a first pulley of the first pulley group; and a first connecting member coupling the first belt and the first moving unit;
a second moving unit moving linearly on the first moving unit;
a second drive unit provided in the first moving unit and configured to drive the second moving unit, the second drive unit comprising: a second motor to drive the second moving unit;
a bearer attached to the second moving unit and configured to support a substrate being transferred; and
a detecting unit provided with a rotational axis on a front end of a side surface of the first moving unit and configured to detect substrates being transferred when the second moving unit is in motion,
wherein an enclosure of the first drive unit at least partially overlaps with an enclosure of the second drive unit in vertical direction, and motions of the first drive unit and the second drive unit are independently controlled, and
wherein the detecting unit is configured to rotate about the rotational axis to switch between a detecting position whereat the substrates being transferred are detected and a retracted position whereat the detecting unit is incapable of detecting the substrates being transferred.

2. The substrate processing apparatus of claim 1, further comprising: a transfer shelf whereon a substrate container containing a substrate to be transferred is placed; and a controller controlling the first motor, the second motor and the third motor to transfer substrates between the substrate container and the substrate retainer, wherein a distance between a center of the transfer device and the substrate retainer is different from a distance between the center and the substrate container placed on the transfer shelf, and the base includes a rotational axis disposed on a line connecting the substrate retainer and the substrate container placed on the transfer shelf.

3. The substrate processing apparatus of claim 2, wherein the bearer is made of stainless steel and configured to vertically support predetermined number of substrates being transferred at a time with a predetermined vertical distance between the substrates.

4. The substrate processing apparatus of claim 3, wherein the bearer comprises first, second, third, fourth and fifth tweezers vertically arranged, wherein the fifth tweezer is fixed; the first, the second, the third and the fourth tweezers are attached to first, second, third and fourth mounts, respectively; the first and the third mounts are coupled to a first screw member; the second and the fourth mounts are coupled to a second screw member; and the first, the second, the third and the fourth mounts have different pitches such that distances between the first and the second tweezers, the second and the third tweezers, the third and the fourth tweezers, and the fourth and the fifth tweezers are equal to one another when the first and the second screw members are rotated by fourth and fifth motors to move the first, the second, the third and the fourth mounts.

5. The substrate processing apparatus of claim 2, wherein an enclosure of the first moving unit has a concave portion, and at least a portion of the second moving unit is provided in the concave portion.

6. The substrate processing apparatus of claim 5, wherein a width of a top surface of the base is smaller than a width of a bottom surface of the base.

7. The substrate processing apparatus of claim 5, wherein the second drive unit further comprising: a second pulley group; a second belt wound on the second pulley group; and a second connecting member coupling the second belt and the second moving unit, and the second motor is coupled to and configured to drive a second pulley of the second pulley group.

8. The substrate processing apparatus of claim 2, wherein the distance between the center of the transfer device and the substrate retainer is longer than the distance between the center and the substrate container accommodating the substrate to be transferred.

9. The substrate processing apparatus of claim 1, wherein a height of the detecting unit at the detecting position is same as a height of a front surface or a back surface of the substrates being supported by the bearer.

10. A substrate processing apparatus comprising:
a process chamber where a substrate supported by a substrate retainer is processed; and
a transfer device transferring the substrate to the substrate retainer, the transfer device comprising:
a base capable of rotation by a third motor;
a first moving member moving linearly on the base;
a first drive unit provided on the base and configured to drive the first moving member with a first motor;
a second moving member moving linearly on the first moving member;
a second drive unit provided in the first moving member and configured to drive the second moving member with a second motor;
a bearer attached to the second moving member and configured to support a substrate being transferred; and
a mapping sensor provided on the first moving member, wherein the mapping sensor is configured to detect a substrate in the substrate retainer or a substrate container and move between a detecting position whereat substrates being transferred are detected and a retracted position whereat the mapping sensor is incapable of detecting the substrates being transferred,
wherein a range of motion of the first moving member at least partially overlaps in vertical direction with a range of motion of the second moving member, and motions of the first drive unit and the second drive unit are independently controlled.

11. The substrate processing apparatus of claim 10, wherein a near end of the range of the second moving member coincides with a near end of motion of the first moving member when both of first moving member and the second moving member move to the respective near end.

12. A substrate processing apparatus comprising:
a process chamber where a substrate supported by a substrate retainer is processed; and
a transfer device transferring the substrate to the substrate retainer, the transfer device comprising:
a base capable of rotation by a third motor;
a first moving unit moving linearly on the base;

a first drive unit provided on the base and configured to drive the first moving unit, the first drive unit comprising: a first pulley group; a first belt wound on the first pulley group, a first electrical-drive motor coupled to and configured to drive a first pulley of the first pulley group; and a first connecting member interlocking the first belt and the first moving unit so that the first belt and the first moving unit move exactly together;

a second moving unit moving linearly on the first moving unit;

a second drive unit provided in the first moving unit and configured to drive the second moving unit, the second drive unit comprising: a second electrical-drive motor to drive the second moving unit;

a bearer attached to the second moving unit and configured to support a substrate in the substrate retainer or a substrate container; and a detecting unit configured to detect substrates being transferred, wherein an enclosure of the first drive unit at least partially overlaps with an enclosure of the second drive unit in vertical direction, and motions of the first drive unit and the second drive unit are independently controlled, and wherein the detecting unit is configured to move between a detecting position whereat the substrates being transferred are detected and a retracted position whereat the detecting unit is incapable of detecting the substrates being transferred.

13. A method of manufacturing a semiconductor device using the substrate processing apparatus according to claim 2, the method comprising:
   (a) transferring a substrate to the substrate retainer by the transfer device;
   (b) processing the substrate supported by the substrate retainer; and
   (c) transferring the substrate processed in (b) from the substrate retainer into the substrate container by the transfer device.

\* \* \* \* \*